US009367956B2

(12) United States Patent
O'Brien et al.

(10) Patent No.: US 9,367,956 B2
(45) Date of Patent: Jun. 14, 2016

(54) WINDOWED SIMULATION IN FLUID FLOWS

(71) Applicants: Michael K. O'Brien, Albany, CA (US); Dave Hale, Berkeley, CA (US); Ryan Kautzman, San Francisco, CA (US); Jiayi Chong, San Bruno, CA (US)

(72) Inventors: Michael K. O'Brien, Albany, CA (US); Dave Hale, Berkeley, CA (US); Ryan Kautzman, San Francisco, CA (US); Jiayi Chong, San Bruno, CA (US)

(73) Assignee: Pixar, Emeryville, CA (US)

( * ) Notice: Subject to any disclaimer, the term of this patent is extended or adjusted under 35 U.S.C. 154(b) by 589 days.

(21) Appl. No.: 13/843,595

(22) Filed: Mar. 15, 2013

(65) Prior Publication Data
US 2014/0005994 A1    Jan. 2, 2014

Related U.S. Application Data

(60) Provisional application No. 61/665,251, filed on Jun. 27, 2012.

(51) Int. Cl.
G06F 17/50     (2006.01)
G06T 17/00     (2006.01)
G06G 7/57      (2006.01)
G06T 13/20     (2011.01)
G06T 15/04     (2011.01)

(52) U.S. Cl.
CPC  *G06T 17/00* (2013.01); *G06G 7/57* (2013.01); *G06T 13/20* (2013.01); *G06T 15/04* (2013.01); *G06F 17/5009* (2013.01); *G06T 2210/24* (2013.01); *G06T 2210/36* (2013.01)

(58) Field of Classification Search
USPC ................... 703/2, 6; 345/473, 420, 419, 587
See application file for complete search history.

(56) References Cited

U.S. PATENT DOCUMENTS

| 5,696,892    | A  * | 12/1997 | Redmann  | G06T 13/20 345/473 |
| 7,580,043    | B2 * | 8/2009  | Schilling | G06T 15/04 345/587 |
| 7,643,025    | B2 * | 1/2010  | Lange    | G02B 27/22 345/419 |
| 2007/0070078 | A1 * | 3/2007  | Schilling | G06T 15/04 345/582 |
| 2010/0085423 | A1 * | 4/2010  | Lange    | G02B 27/22 348/46 |
| 2014/0002453 | A1 * | 1/2014  | O'Brien  | G06G 7/57 345/420 |

* cited by examiner

Primary Examiner — Thai Phan
(74) Attorney, Agent, or Firm — Patterson + Sheridan, LLP

(57) ABSTRACT

A simulation application simulates a fluid flow. The simulation application divides a fluid into coarse volumetric elements (voxels) at a first resolution, and simulates the fluid flow at the first resolution. The simulation application defines a three-dimensional window that includes a portion of the coarse voxels. The simulation application divides each coarse voxel in the portion of the coarse voxels that lie within the three-dimensional window into a plurality of fine voxels at a second resolution. The simulation application simulates the fluid flow associated with each fine voxel in the plurality of fine voxels at the second resolution based at least in part on the simulation at the coarse resolution.

20 Claims, 7 Drawing Sheets

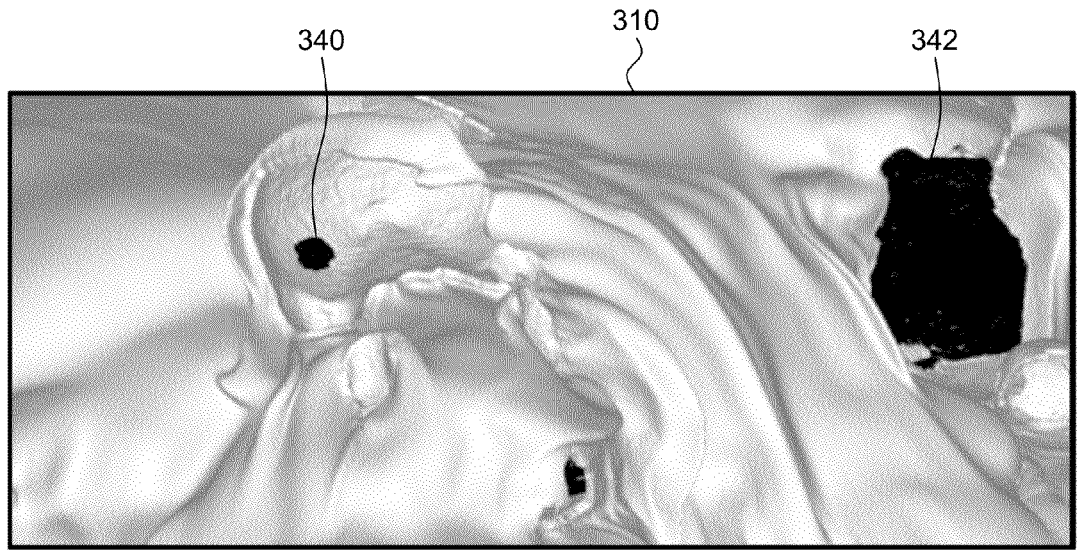
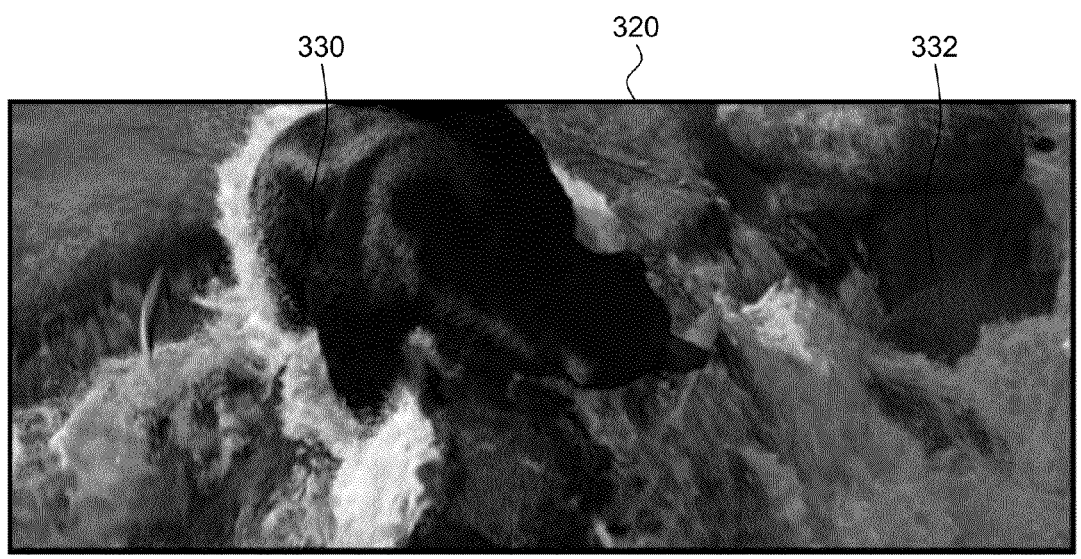
Figure 3

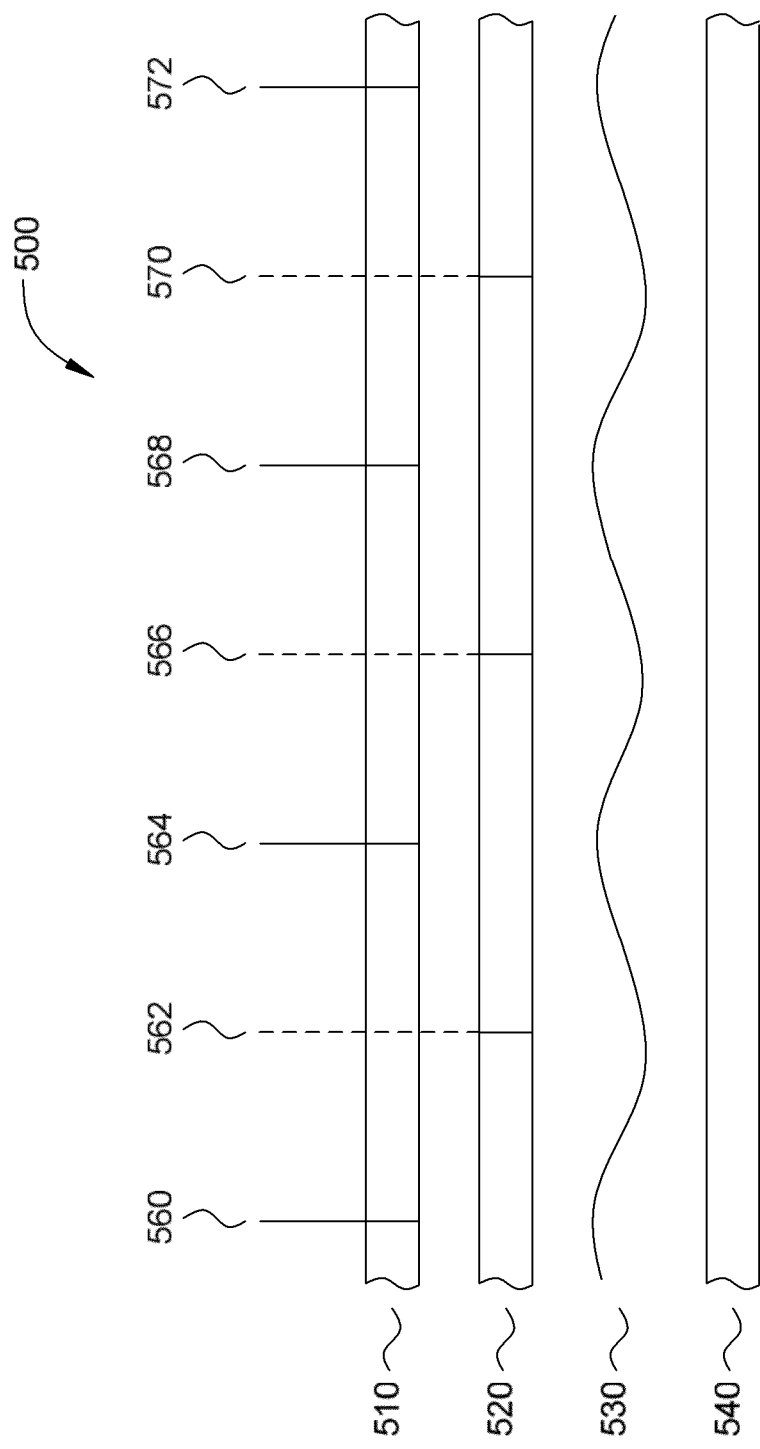

WINDOWED SIMULATION IN FLUID FLOWS

CROSS-REFERENCE TO RELATED APPLICATIONS

This application claims the priority benefit of provisional U.S. patent application entitled "WINDOWED SIMULATION AND ADVECTION OF UV TEXTURE MAPS," Ser. No. 61/665,251, filed Jun. 27, 2012, which is hereby incorporated herein by reference.

BACKGROUND OF THE INVENTION

1. Field of the Invention

The present invention relates to the field of computer animation and, in particular, to windowed simulation in fluid flows.

2. Description of the Related Art

In computer animation, fluid flows are typically modeled by dividing the fluid into regions, typically represented as cubic regions, called volumetric elements, or voxels, where each voxel includes a portion of the fluid. The fluid flow, as modeled by the collection of voxels, serves as input to a software application that simulates the fluid flow over time. At specific points in time, the simulated fluid flow is rendered to a 2D image representing a frame of film or video. A collection of these rendered images may then be played in sequence to visualize the fluid flow. The fluid flow may be composited with other visual elements to create a final rendered image.

Each voxel in the fluid flow may be rendered over time by measuring the amount of fluid within each voxel at a given image frame, as determined by the simulation software application. As the simulation progresses, fluid may enter a given voxel at some locations and exit the voxel in other locations. The net volume of fluid in the voxel may increase, decrease, or remain the same from a particular image frame to the next image frame. Each voxel is rendered to a 2D surface, representing the view of a virtual camera, to create the image of the fluid. One drawback with this approach is that volumetric rendering is compute intensive. When simulating large fluid flows, such as the water flowing in a large river, the amount of time needed to create each image frame may be unacceptably long, even when a substantially high quantity of servers are deployed to perform the simulation and rendering of the fluid flow. One possible solution is to increase the size of each voxel in the fluid flow, thereby decreasing the number of voxels in the overall fluid flow that are simulated and rendered. However, a small voxel size is often desired in order to model fine detail of the fluid flow, thereby creating a more realistic and visually pleasing image.

The surface of such a fluid flow may be modeled by computing a height field that defines the displacement of the surface of the fluid over time. For example, when modeling the surface of a body of water, an increasing height field may represent an area of the surface where a wave is developing, while a decreasing height field may represent an area of the surface where a trough is developing. Again, a simulation software application may simulate the surface characteristics, based on changes in the height field over time, and the simulation is rendered at specific points to create a series of images representing the surface of the fluid. One drawback with this approach is that such height field models may provide reasonable simulations for relatively stable fluids, such as an ocean surface, these models may not provide a realistic surface image for rapidly moving fluids, such as the surface of a rushing river.

SUMMARY OF THE INVENTION

One embodiment of the present invention includes a method for simulating a fluid flow. The method includes dividing a fluid into a plurality of coarse voxels at a first resolution, and simulating the fluid flow associated with each coarse voxel in the plurality of coarse voxels at the first resolution. The method further includes defining a three-dimensional window that includes a portion of the coarse voxels, and dividing each coarse voxel in the portion of the coarse voxels into a plurality of fine voxels at a second resolution. The method further includes simulating the fluid flow associated with each fine voxel in the plurality of fine voxels at the second resolution, based at least in part on the simulation at the coarse resolution.

One embodiment of the present invention includes a method for modeling a surface of a fluid in motion. The method includes selecting a mesh point from a plurality of mesh points that is associated with the surface of the fluid. The method further includes retrieving a first texture element from a set of uv texture maps, and attaching a first displacement value to the mesh point based on the first texture element. The method further includes advecting the first displacement value over a first duration represented by a first quantity of image frames such that the first displacement value remains attached to the mesh point as the plurality of mesh points moves in response to a motion of the fluid.

Other embodiments include, without limitation, a computer-readable storage medium that includes instructions that enable a processing unit to implement one or more aspects of the disclosed methods as well as a computing system configured to implement one or more aspects of the disclosed methods.

BRIEF DESCRIPTION OF THE DRAWINGS

So that the manner in which the above recited features of the invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3 shows an example of a windowed simulation image frame and a corresponding final image frame, according to one embodiment of the present invention;

FIG. 5 illustrates a set of properties corresponding with a point on a mesh that is associated with a fluid surface, according to one embodiment of the present invention.

DETAILED DESCRIPTION

In the following description, numerous specific details are set forth to provide a more thorough understanding of the present invention. However, it will be apparent to one of skill in the art that the present invention may be practiced without one or more of these specific details.

Hardware Overview

Figure 1:
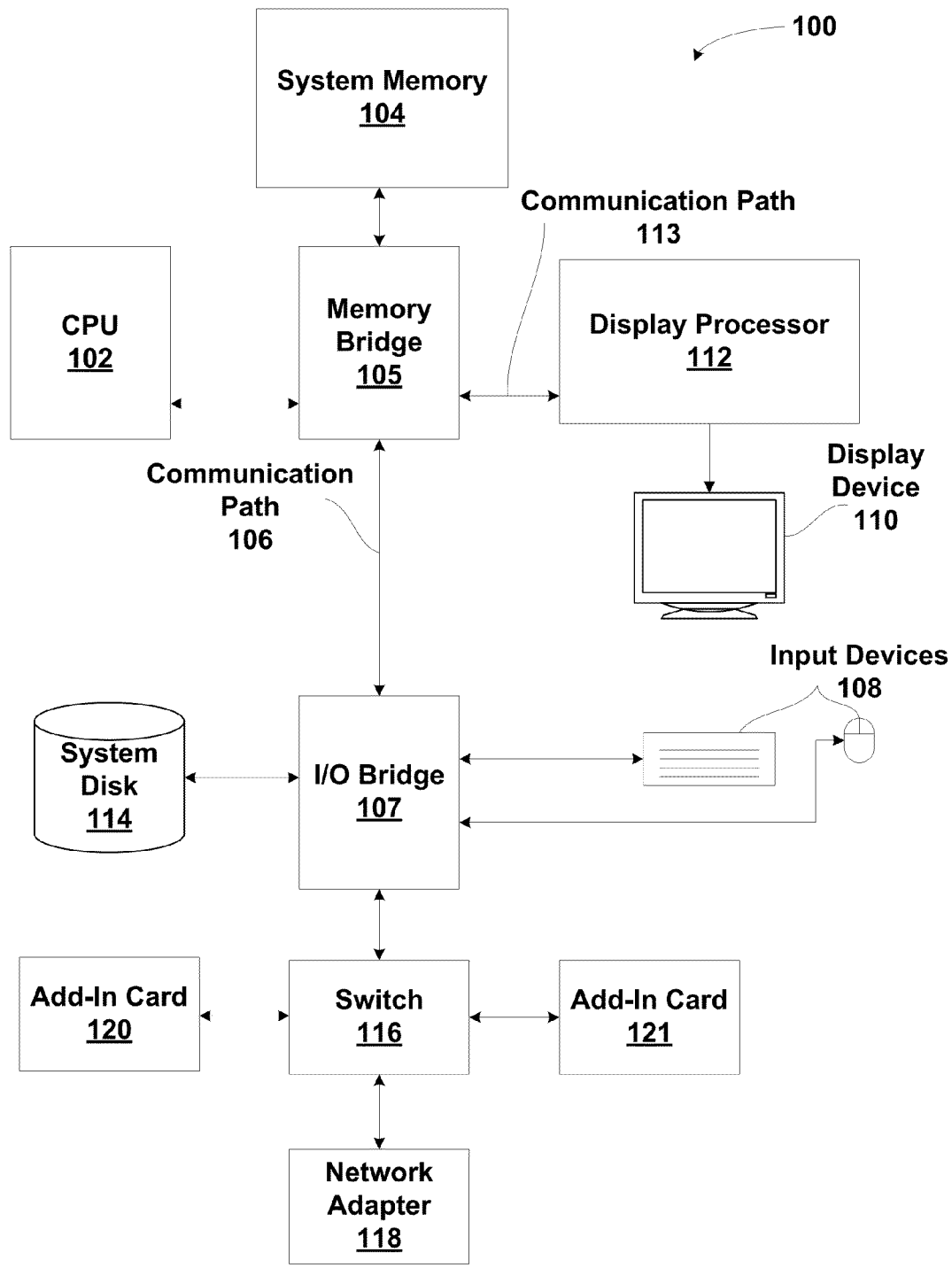
FIG. 1 is a block diagram of a system configured to implement one or more aspects of the invention.

FIG. 1 depicts one architecture of a system 100 within which embodiments of the present invention may be implemented. This figure in no way limits or is intended to limit the scope of the present invention.

System 100 may be a personal computer, video game console, personal digital assistant, rendering engine, or any other device suitable for practicing one or more embodiments of the present invention.

As shown, system 100 includes a central processing unit (CPU) 102 and a system memory 104 communicating via a bus path that may include a memory bridge 105. CPU 102 includes one or more processing cores, and, in operation, CPU 102 is the master processor of system 100, controlling and coordinating operations of other system components. System memory 104 stores software applications and data for use by CPU 102. CPU 102 runs software applications and optionally an operating system. Memory bridge 105, which may be, e.g., a Northbridge chip, is connected via a bus or other communication path 106 (e.g., a HyperTransport link) to an I/O (input/output) bridge 107. I/O bridge 107, which may be, e.g., a Southbridge chip, receives user input from one or more user input devices 108 (e.g., keyboard, mouse, joystick, digitizer tablets, touch pads, touch screens, still or video cameras, motion sensors, and/or microphones) and forwards the input to CPU 102 via memory bridge 105.

A display processor 112 is coupled to memory bridge 105 via a bus or other communication path 113 (e.g., a PCI Express, Accelerated Graphics Port, or HyperTransport link); in one embodiment display processor 112 is a graphics subsystem that includes at least one graphics processing unit (GPU) and graphics memory. Graphics memory includes a display memory (e.g., a frame buffer) used for storing pixel data for each pixel of an output image. Graphics memory can be integrated in the same device as the GPU, connected as a separate device with the GPU, and/or implemented within system memory 104.

Display processor 112 periodically delivers pixels to a display device 110 (e.g., a screen or conventional CRT, plasma, OLED, SED or LCD based monitor or television). Additionally, display processor 112 may output pixels to film recorders adapted to reproduce computer generated images on photographic film. Display processor 112 can provide display device 110 with an analog or digital signal.

A system disk 114 is also connected to I/O bridge 107 and may be configured to store content and applications and data for use by CPU 102 and display processor 112. System disk 114 provides non-volatile storage for applications and data and may include fixed or removable hard disk drives, flash memory devices, and CD-ROM, DVD-ROM, Blu-ray, HD-DVD, or other magnetic, optical, or solid state storage devices.

A switch 116 provides connections between I/O bridge 107 and other components such as a network adapter 118 and various add-in cards 120 and 121. Network adapter 118 allows system 100 to communicate with other systems via an electronic communications network, and may include wired or wireless communication over local area networks and wide area networks such as the Internet.

Other components (not shown), including USB or other port connections, film recording devices, and the like, may also be connected to I/O bridge 107. For example, an audio processor may be used to generate analog or digital audio output from instructions and/or data provided by CPU 102, system memory 104, or system disk 114. Communication paths interconnecting the various components in FIG. 1 may be implemented using any suitable protocols, such as PCI (Peripheral Component Interconnect), PCI Express (PCI-E), AGP (Accelerated Graphics Port), HyperTransport, or any other bus or point-to-point communication protocol(s), and connections between different devices may use different protocols, as is known in the art.

In one embodiment, display processor 112 incorporates circuitry optimized for graphics and video processing, including, for example, video output circuitry, and constitutes a graphics processing unit (GPU). In another embodiment, display processor 112 incorporates circuitry optimized for general purpose processing. In yet another embodiment, display processor 112 may be integrated with one or more other system elements, such as the memory bridge 105, CPU 102, and I/O bridge 107 to form a system on chip (SoC). In still further embodiments, display processor 112 is omitted and software executed by CPU 102 performs the functions of display processor 112.

Pixel data can be provided to display processor 112 directly from CPU 102. In some embodiments of the present invention, instructions and/or data representing a scene are provided to a render farm or a set of server computers, each similar to system 100, via network adapter 118 or system disk 114. The render farm generates one or more rendered images of the scene using the provided instructions and/or data. These rendered images may be stored on computer-readable media in a digital format and optionally returned to system 100 for display. Similarly, stereo image pairs processed by display processor 112 may be output to other systems for display, stored in system disk 114, or stored on computer-readable media in a digital format.

Alternatively, CPU 102 provides display processor 112 with data and/or instructions defining the desired output images, from which display processor 112 generates the pixel data of one or more output images, including characterizing and/or adjusting the offset between stereo image pairs. The data and/or instructions defining the desired output images can be stored in system memory 104 or graphics memory within display processor 112. In an embodiment, display processor 112 includes 3D rendering capabilities for generating pixel data for output images from instructions and data defining the geometry, lighting shading, texturing, motion, and/or camera parameters for a scene. Display processor 112 can further include one or more programmable execution units capable of executing shader programs, tone mapping programs, and the like.

CPU 102, render farm, and/or display processor 112 can employ any surface or volume rendering technique known in the art to create one or more rendered images from the provided data and instructions, including rasterization, scanline rendering REYES or micropolygon rendering, ray casting, ray tracing, image-based rendering techniques, and/or combinations of these and any other rendering or image processing techniques known in the art.

It will be appreciated that the system shown herein is illustrative and that variations and modifications are possible. The connection topology, including the number and arrangement of bridges, may be modified as desired. For instance, in some embodiments, system memory 104 is connected to CPU 102 directly rather than through a bridge, and other devices communicate with system memory 104 via memory bridge 105 and CPU 102. In other alternative topologies display processor 112 is connected to I/O bridge 107 or directly to CPU 102, rather than to memory bridge 105. In still other embodiments, I/O bridge 107 and memory bridge 105 might be integrated into a single chip. The particular components shown herein are optional; for instance, any number of add-in cards or peripheral devices might be supported. In some embodiments, switch 116 is eliminated, and network adapter 118 and add-in cards 120, 121 connect directly to I/O bridge 107.

Windowed Simulation

A fluid flow is simulated and rendered by modeling the fluid at two different resolutions. The fluid flow is first simulated and rendered at a coarse resolution, called a "base simulation," where the resolution is based on the computing resources available to perform the simulation and the amount of time available to perform the simulation and rendering. Typically, such a simulation is performed by using a software application using a multiphysics simulation library that is capable of performing a variety of operations, including, without limitation, simulating rigid & deformable bodies, compressible & incompressible fluids, coupled solids & fluids, coupled rigid & deformable solids, articulated rigid bodies & humans, fracture, fire, smoke, hair, cloth, muscles, as well as many other natural phenomena. In one example, a model of a river that contain 486 m$^3$ could be divided into 81 million voxels, where each voxel would be approximately 6 cm$^3$. The rendered frames may be visualized as a film or video clip to view the look of the coarse simulation. At such a coarse resolution, the surface of the water may appear blocky and unnatural. However, a fluid flow representing the river could be simulated with reasonable compute resources in a reasonable amount of time. While this base simulation does not have a sufficiently fine resolution for the final animation, the base simulation is good enough to determine whether the overall flow of the river is acceptable, whether the depth of the river at various points gives a visually pleasing look, and so on.

Once the overall look of the base simulation is acceptable, a portion of the base simulation is selected as a domain for simulation and rendering at a finer resolution, called a "windowed simulation." The domain of the windowed simulation is typically defined by the viewing frustum of a virtual camera that includes at least part of the fluid flow within the viewing frustum. Then, for each shot, the intersection of the camera frustum with the coarse simulation may be determined. The coarse voxels that lie within the selected domain are then subdivided into fine voxels. For example, each 6 cm$^3$ coarse voxel could be subdivided into 12$^3$ or 1728 fine voxels, where each fine voxel is 0.5 cm$^3$. A typical domain for a windowed simulation could be 160 million fine voxels. The fine voxels that lie within the domain defined by the windowed simulation are then simulated at the fine resolution. The simulation results of the base simulation serve as an input to the windowed simulation. Accordingly, the fluid contained within a coarse voxel is divided such that each fine voxel within the coarse voxel includes a corresponding portion of the fluid contained within the coarse voxel. The domain defined by the windowed simulation is simulated and rendered at the fine resolution, resulting in image frames with sufficient detail to be composited with other objects into the final film or video images. In shots where a substantial portion of the fluid is in view, the base simulation may have sufficient detail for final rendering of distant portions of the fluid, while the windowed simulation may be deployed for closer portions of the fluid, where a higher level of detail is desired.

Figure 2:
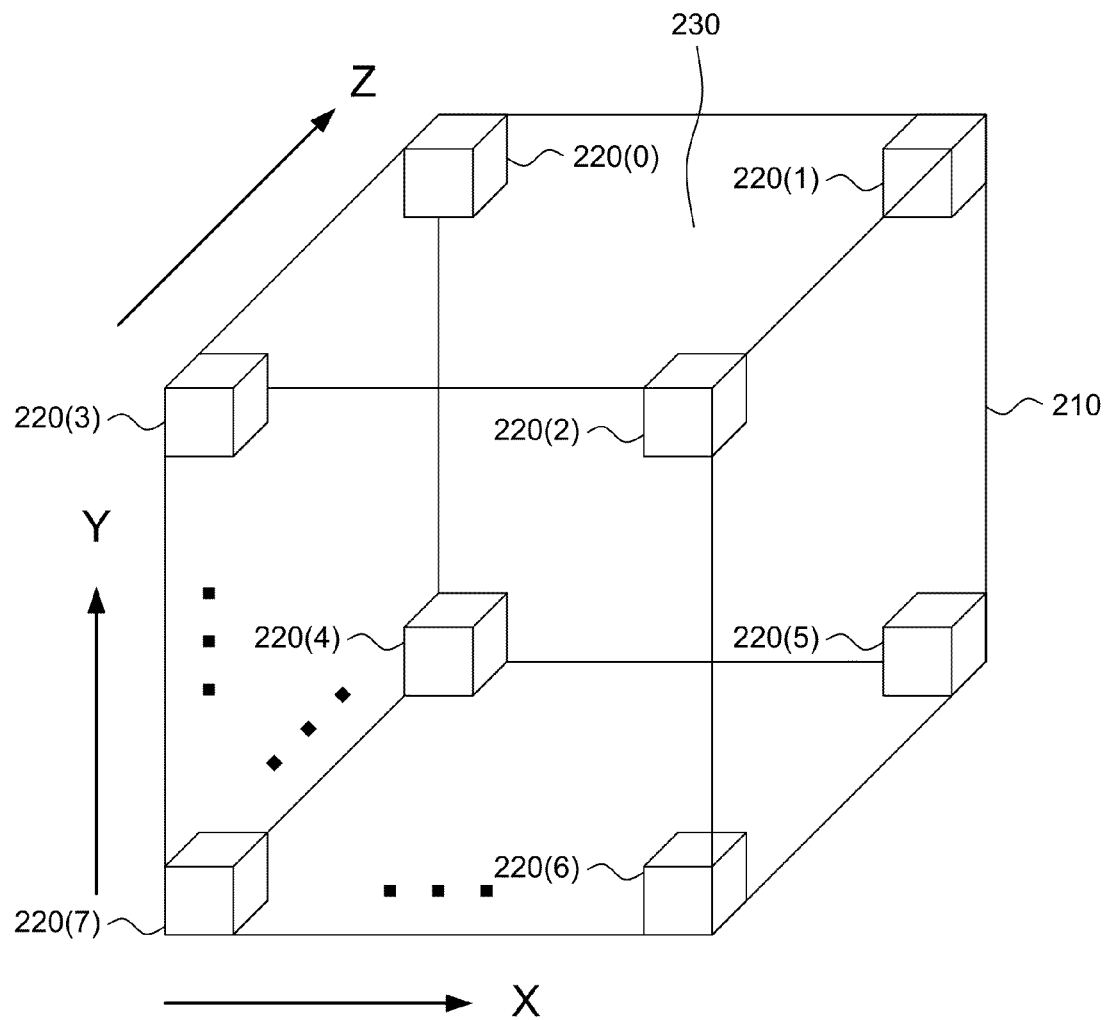
FIG. 2 illustrates a coarse voxel and corresponding fine voxels, according to one embodiment of the present invention.

FIG. 2 illustrates a coarse voxel 210 and corresponding fine voxels 220, according to one embodiment of the present invention. As shown, the coarse voxel 210 includes a plurality of fine voxels 220.

The coarse voxel 210 represents the resolution of the base simulation. The entire volume of the fluid is divided into a three-dimensional grid of coarse voxels 210. The fluid is simulated using the coarse voxels 210. At each step in the simulation, the simulation determines the amount of fluid contained in each coarse voxel 210. Once the base simulation is complete, the base simulation is rendered to determine whether the overall flow, depth, etc. of the fluid are visually correct. However, the base simulation does not have sufficiently fine detail to use in the final film or video images. Accordingly, coarse voxels 210 are subdivided into fine voxels 220.

The fine voxels 220 represents the resolution of the windowed simulation. A domain is selected, where the domain includes a portion of the coarse voxels in the base simulation. This domain defines the portion of the fluid for the windowed simulation. Each coarse voxel 210 that lies within the domain is subdivided such that fine voxels 220 completely fill the volume defined by the coarse voxel 210. For the purpose of clarity, only a subset of the fine voxels 220 corresponding to the coarse voxel 210 are shown. Each fine voxel 220 contains a proportional amount of the fluid volume contained within the coarse voxel 220.

Certain conditions of a fluid flow may cause the volume computed for the domain defined by the windowed simulation to diverge from the volume computed for the corresponding portion of the base simulation. In one example, a laminar flow could be defined for a fluid, where the fluid moves more or less in the x-direction at a constant velocity, that is, the velocity vectors defining the fluid motion are relatively constant in magnitude and direction at all points within the base simulation. In such a fluid flow, the behavior of the fluid within the domain would be relatively consistent with the behavior of the fluid outside of the domain. As a result, there would be little or no divergence between the fluid flow computed for the windowed simulated within the domain at the fine resolution and the fluid flow computed for the corresponding portion of the base simulation.

By contrast, in another example, a turbulent flow could be defined for a fluid, where the velocity vectors would be at varying magnitudes and directions. In such a fluid flow, the behavior of the fluid within the domain could be significantly different from the behavior of the fluid outside of the domain. As a result, there could be significant divergence between the fluid flow computed for the windowed simulated within the domain at the fine resolution and the fluid flow computed for the corresponding portion of the base simulation. Such a divergence would cause a change in water level in the windowed simulation as compared to the base simulation. If the volume of the windowed simulation is more than the volume of the corresponding portion of the base simulation, then the windowed simulation would show an increase in fluid level as compared to same portion of the base simulation. If, on the other hand, the volume of the windowed simulation is less than the volume of the corresponding portion of the base simulation, then the windowed simulation would show a decrease in fluid level as compared to same portion of the base simulation.

To remedy this disparity, a reference divergence field is created that measures the divergence contained within the baseline simulation corresponding to the domain of the windowed simulation at various locations. The divergence may be calculated by computing the volume of the windowed simulation and the volume of the corresponding portion of the base simulation. The volume of the base simulation is then subtracted from the volume of the windowed simulation. If the divergence value is positive, then the windowed simulation includes more fluid than the corresponding portion of the base simulation. Corrective divergence is subtracted from the fine voxels 220 in the domain defined by the windowed simulation. If the divergence value is negative, then the windowed simulation includes less fluid than the corresponding portion of the base simulation. Corrective divergence is added to the fine voxels 220 in the domain defined by the windowed simulation. The corrective divergence may be divided among the fine voxels 220 in the domain such that each fine voxel 220 takes a portion of the divergence. In order to avoid creating surface artifacts, the corrective divergence may be applied to fine voxels 220 that are at some distance below a fluid surface. For example, if the top face 230 of the coarse voxel 220 is at the surface of the fluid, then corrective divergence could be applied to fine voxels 220(4)-220(7) but would not be applied to fine voxels 220(0)-220(3).

In some embodiments, the simulation software application may not respond immediately when corrective divergence is added to or subtracted from the voxels in a domain. Accordingly, the water level may not increase immediately when corrective divergence is added or decrease immediately when divergence is subtracted from the voxels. In such cases, corrective divergence may be applied slowly over time to avoid overcorrection and oscillation between a high positive divergence and a high negative divergence. The divergence may be continuously monitored and corrective divergence applied at a rate that causes the divergence to be near zero at any given point during the simulation.

In some embodiments, the corrective divergence may be applied to the voxels using a biphasic approach. That is, if the divergence is below a certain threshold, then corrective divergence may be applied at a slower rate. If the divergence is above the threshold, then corrective divergence may be applied at a higher rate. Such a biphasic approach may serve to reduce overall divergence while avoiding overcorrection and oscillation. In some embodiments, the threshold may be adjustable by a user and may or may not be symmetric. For example, the threshold could be initialized to 2.5%. In such a case, corrective divergence would be applied at a slower rate until the divergence is more than plus or minus 2.5%. If the divergence exceeds plus or minus 2.5%, then corrective divergence would be applied at a faster rate. In another example, if the user adjusts the threshold to −1%/+10%, then corrective divergence would be applied at a slower rate until the divergence is more than 1% below or 10% above the base simulation. plus or minus 2.5%. If the divergence exceeds these limits, then divergence would be applied at a higher rate.

In some embodiments, the size of the domain for the windowed simulation may be increased by one or more voxels in one, two, or all three dimensions in order to provide more realistic images at the boundary of the windowed simulation. Because of the divergence between the domain of the windowed simulation versus the corresponding portion of the base simulation, as described above, the fluid flow within a set of fine voxels 220 may not match the fluid flow of the corresponding coarse voxel 210. This divergence may cause undesireable artifacts at the border of the domain. If the domain defines a viewing frustum corresponding to an image frame, such artifacts may cause the fluid flow to look unnatural where the fluid intersects with the boarder of the image frame. To reduce such artifacts, the size of the domain may be increased by one or more coarse voxels in one, two, or all three dimensions. As a result, artifacts related to boundary effects are outside of the viewing frustum and do not appear within the image frame. In one example, the domain of the windowed simulation could be increased by three voxels in all three dimensions.

FIG. 3 shows an example of a windowed simulation image frame 310 and a corresponding final image frame 320, according to one embodiment of the present invention.

Characters and other objects that interact with the fluid may be treated as colliders that divert the fluid flow. For example, the bear 330 and the rock outcropping 332 in the final image frame 320 could be modeled as colliders in the windowed simulation, creating obstacles that impede and direct the fluid flow. The colliders create corresponding cavities 340 342 in the image frame 310 of the windowed simulation.

Figure 4:
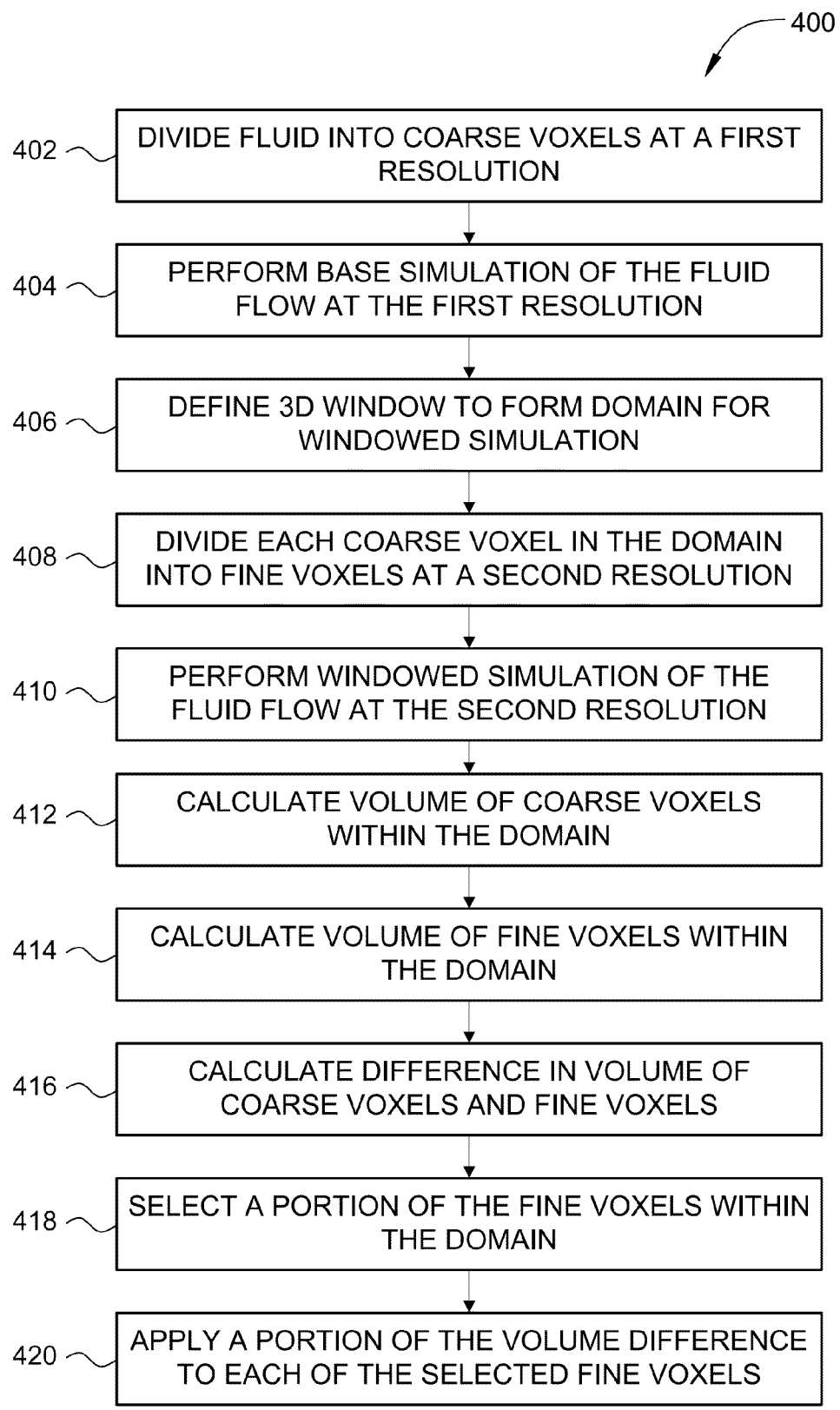
FIG. 4 sets forth a flow diagram of method steps for simulating a fluid flow, according to one embodiment of the present invention.

FIG. 4 sets forth a flow diagram of method steps for simulating a fluid flow, according to one embodiment of the present invention. Although the method steps are described in conjunction with the systems of FIG. 1, persons of ordinary skill in the art will understand that any properly configured computing system is within the scope of the present invention, where such a computing system may include a processing unit configured to perform the method steps described herein. Such processing units may include, without limitation, one or more central processing units (CPUs), one or more multi-core CPUs, one or more parallel processing units (PPUs), one or more graphics processing units (GPUs), one or more special purpose processing units, or the like. Further, although the method steps are described in conjunction with a processing unit, persons skilled in the art will understand that any system configured to perform the method steps, in any order, is within the scope of the present invention.

As shown, a method 400 begins at step 402, where a software application, such as a simulation application, divides a fluid into coarse voxels at a first resolution. For example, each coarse voxel could be 6 cm$^3$. At step 404, the software application simulates the fluid flow associated with each coarse voxel at the first resolution, creating a base simulation. At step 406, the software application defines a three-dimensional window that includes a portion of the coarse voxels, forming a domain for the windowed simulation. In one example, the size of the domain could be the size of the viewing frustum of a virtual camera directed at the fluid. In another example, the size of the domain could be greater than the size of the viewing frustum by one or more coarse voxels in one, two, or three dimensions.

At step 408, the software application divides each coarse voxel in the domain into a plurality of fine voxels at a second resolution. For example, each fine voxel could be 0.5 cm$^3$. At step 410, the software application simulates the fluid flow associated with each fine voxel in the plurality of fine voxels at the second resolution. At step 412, the software application calculates the volume associated with the coarse voxels within the domain by summing the volumes for each coarse voxel in the domain. At step 414, the software application calculates the volume associated with the fine voxels in the domain. At step 416, the software application calculates the difference between the volumes based on the coarse voxels and the value based on the fine voxels. At step 418, the software application selects a portion of the fine voxels within the domain.

At step 420, the software application applies a portion of the difference to each fine voxel in the selected portion of fine voxels. The software application may apply the difference to the selected fine voxels over a period of time. The rate at which the difference is applied to the selected fine voxels may be determined by comparing the difference to a threshold value. If the magnitude of the difference is below the threshold, then the difference may be applied at a slower rate. If the magnitude of the difference is above the threshold, then the difference may be applied at a faster rate. In some embodiments, the threshold may be adjustable by a user. The threshold may be one value when the volume in the domain from the base simulation is less than the volume in the domain from the windowed simulation. The threshold may be a different value when the volume in the domain from the base simulation is greater than the volume in the domain from the windowed simulation. The method 400 then terminates.

Advection of UV Texture Maps

Once the fluid has been simulated, as described above, surface characteristics are applied to the fluid, thereby creating a more realistic appearance. Such surface characteristics may be achieved by attaching uv texture maps to the fluid surface and advecting the uv texture maps via the fluid flow, as further described below. Generally, a uv texture map refers to a two-dimensional texture having axes "u" and "v," and the process of uv texture mapping refers to mapping such a two-dimensional texture onto a three-dimensional object.

FIG. 5 illustrates a set of properties 500 corresponding with a point on a mesh that is associated with a fluid surface, according to one embodiment of the present invention. As shown, the set of properties 500 includes a first uv texture displacement 510, a second uv texture map displacement 520, a mix function 530, and a surface characteristic 540.

The first uv texture displacement 510 represents a sample derived from one or more texture elements, also known as texels, where the texels are associated with a set of uv texture maps. Surface displacement is of a fluid is simulated by creating a set of uv texture maps in world space and attaching the texels from the uv texture maps to mesh points on the surface of the fluid. The mesh points are arranged in a regular grid pattern to form the surface of the fluid. The uv texture map includes a representation of some surface characteristic, such as a displacement value that is applied to the fluid surface at the mesh points. Applying a positive displacement to a group of mesh points increases the height of the fluid surface, thereby creating a swell or wave. Applying a negative displacement to a group of mesh points decreases the height of the fluid surface, thereby creating a trough. The texels are selected for a specific mesh point as a function of physical position on the fluid and time.

The texels are then "advected" by the fluid. Advection is a transport mechanism of a substance or property by a fluid due to the fluid's bulk motion. One example of advection is the transport of silt by a moving river. As used herein, the texels are advected by the fluid, in that the texels move along a velocity field associated with the fluid flow for some number of image frames. For example, if the texels are attached to mesh points representing the surface of a rushing river, the texels move downstream as the associated mesh points move downstream. The displacement associated with the first uv texture displacement 510 varies over time. As shown, the first uv texture displacement 510 begins at time 560, and then is advected until time 564. After some amount of time, the mesh points may have moved significantly with respect to each other, due to some portions of the fluid moving more rapidly than other portions of the fluid. As a result, the original mesh pattern may be significantly distorted, resulting in a distortion of the first uv texture displacement 510, as applied to a set of mesh points. At time 564, the texels from the first set of uv texture maps are "reset" to match the current mesh points on the surface of the fluid, and the texels are again advected until time 568. At time 568, the texels from the first set of uv texture maps are reset to match the current mesh points on the surface of the fluid, and the texels are again advected until time 572, and so on. When the texels are reset to the fluid surface, a discontinuity in the displacement occurs at the reset point. As a result, the surface of the fluid will appear to "jump" from one frame to the next at each reset point at times 560 564 568 572. In order to hide this discontinuity, a second uv texture displacement 520 is mixed with the first uv texture displacement 510.

The second uv texture map displacement 520 represents a sample derived from one or more texels, where the texels are associated with a set of uv texture maps. In various embodiments, the set of uv texture maps may be the same as the set of uv texture maps used for the first uv texture displacement 510, or the second uv texture map displacement 520 may use a different set of uv texture maps. The second uv texture map displacement 520 begins at a time that is offset from the first uv texture map displacement 510. As shown, the second uv texture map displacement 520 is reset at times 562 566 570, in between the reset points for the first uv texture displacement at times 560 564 568 572. The second uv texture map displacement 520 is determined using the same advection process described above. In one example, the first uv texture map displacement 510 and the second uv texture map displacement 520 could be advected for 50 frames between reset points. The second uv texture map displacement 520 could be reset at points midway between reset points for the first second uv texture map displacement 510. In other words, a reset point for the second uv texture map displacement 520 would occur 25 frames after a reset point for the first uv texture map displacement 510. The second uv texture displacement 520 is mixed with the first uv texture displacement 510 using a mix function 530.

The mix function 530 is a property of each mesh point that determines how much of the first uv texture displacement 510 and the second uv texture displacement 520 contributes to the final displacement of the mesh point. As shown, the mix function 530 is at a maximum at times 560 564 568 572, when the first uv texture displacement 510 resets. At these times, the contribution of the second uv texture displacement 520 is 100%, and the contribution of the first uv texture displacement 510 is 0%. The reset of the first uv texture displacement 510 is thereby hidden from the final image. The mix function 530 is at a minimum at times 562 566 570, when the second uv texture displacement 520 resets. At these times, the contribution of the second uv texture displacement 520 is 0%, and the contribution of the first uv texture displacement 510 is 100%. The reset of the second uv texture displacement 510 is thereby hidden from the final image. The mix function 530 varies between minimum and maximum in between these times, providing a proportional mix of the first uv texture displacement 510 and the second uv texture displacement 520. Although the mix function 530 of FIG. 3 resembles a sine wave, any technically feasibly mix function 530 may be used.

In some embodiments, a dampening function (not shown) is applied to reduce the displacement as determined by the first uv texture displacement 510, the second uv texture map displacement 520, and the mix function 530. Under certain flow conditions, the difference between the first uv texture displacement 510 and the second uv texture map displacement 520, may be high. Such a condition may occur in areas where fast moving water is close to slow moving water. In such cases, mixing the two displacements may result in an image frame that shows a high amount of shear at those locations where the difference is relatively high. A measurement of the shear may be used to reduce to provide a dampening function that is attached to the mesh and serves to reduce the displacement values in the regions of high shear. Such a dampening function reduces the shear effect, resulting in better image quality. As the measured shear increases, the corresponding dampening function also increases, providing a proportional dampening function as a function of measured shear. In one example, the measure of shear, and the corresponding dampening function, may be a function of du×dv.

The surface characteristic 540 is associated with a secondary property of the fluid surface, such as surface foam or bubbles below the surface. The surface characteristic 540 may be modeled via advection of uv texture maps, as described above. Alternatively, the surface characteristic 540 may be modeled via particle simulation. During particles simulation, particles collect in regions where foam would form. Results from the particle simulation may be written to an output file. The output file may then be accessed by a rendering application that places the particles on the post-displaced fluid surface resulting from the advection process, as described above. Alternatively, the surface characteristic 540 may be modeled via any other technically feasible approach. The surface characteristic 540 is attached to the fluid surface at mesh points, and alters the appearance of the fluid surface in the final rendered image. In some embodiments, the surface characteristic 540 is conditioned by a mask function (not shown). The mask function determines the opacity of the surface characteristic at various mesh points along the fluid surface. As such, the mask function reveals or masks the surface characteristic 540 along the fluid surface. For example, surface foam could be revealed at mesh points where the mask function is at a minimum value and masked at mesh points where the mask function is at a maximum. The surface foam could be partially visible at mesh points where the mask function lies between the minimum and maximum values.

Figure 6A:
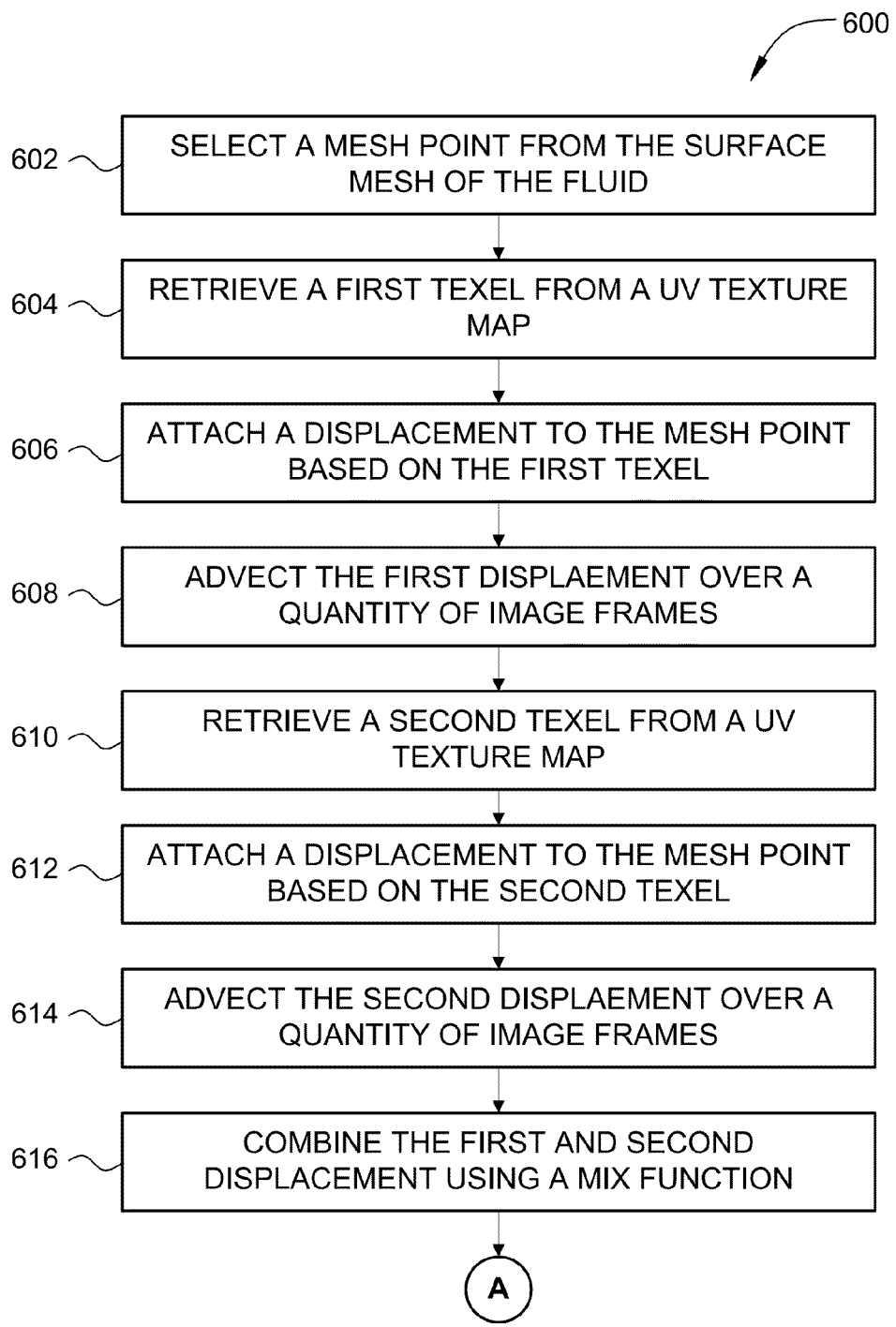
FIGS. 6A-6B set forth a flow diagram of method steps for modeling the surface of a fluid, according to one embodiment of the present invention.
Figure 6B:
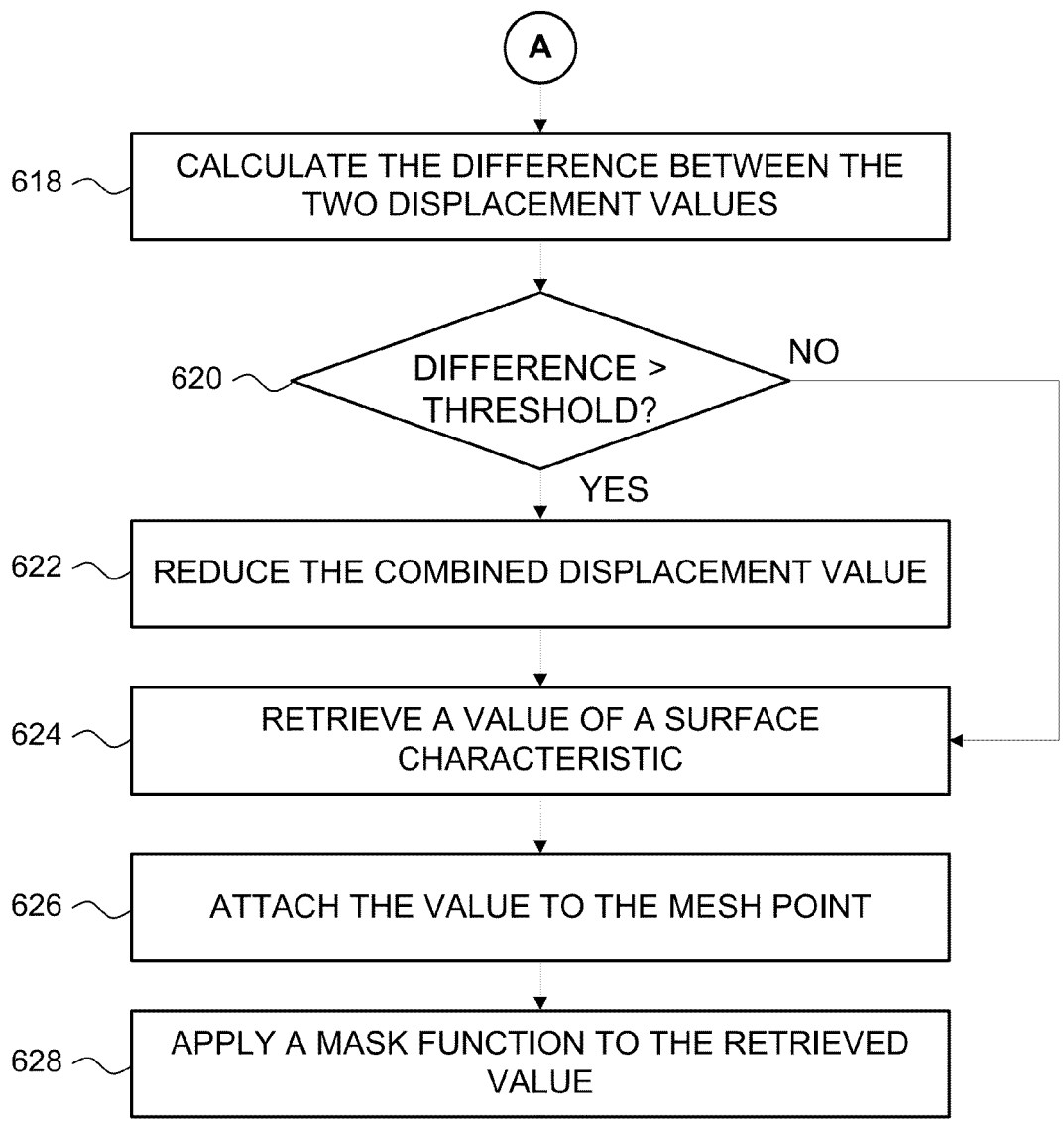

FIGS. 6A-6B set forth a flow diagram of method steps for modeling the surface of a fluid, according to one embodiment of the present invention. Although the method steps are described in conjunction with the systems of FIG. 1, persons of ordinary skill in the art will understand that any properly configured computing system is within the scope of the present invention, where such a computing system may include a processing unit configured to perform the method steps described herein. Such processing units may include, without limitation, one or more central processing units (CPUs), one or more multi-core CPUs, one or more parallel processing units (PPUs), one or more graphics processing units (GPUs), one or more special purpose processing units, or the like. Further, although the method steps are described in conjunction with a processing unit, persons skilled in the art will understand that any system configured to perform the method steps, in any order, is within the scope of the present invention.

As shown, a method 600 begins at step 602, where a software application, such as a simulation application, selects a mesh point from a plurality of mesh points that is associated with the surface of the fluid. At step 604, the software application retrieves a first texture element from a set of uv texture maps. At step 606, the software application attaches a first displacement value to the mesh point based on the first texture element. At step 608, the software application advects the first displacement value over a first duration represented by a first quantity of image frames such that the first displacement value remains attached to the mesh point as the plurality of mesh points moves in response to a motion of the fluid.

At step 610, the software application retrieves a second texture element from the set of uv texture maps. At step 612, the software application attaches a second displacement value to the mesh point based on the second texture element. At step 614, the software application advects the second displacement value over a second duration represented by a second quantity of image frames such that the second displacement value remains attached to the mesh point as the plurality of mesh points moves in response to the motion of the fluid.

At step 616, the software application combines the first displacement value with the second displacement value, based on a mix function, to create a third displacement value. At step 618, the software application calculates the difference between the first displacement value with the second displacement value. At step 620, the software application determines whether the calculated difference exceeds a threshold value, where a difference above the threshold value indicates an excessive sheer condition. If the difference is greater than the threshold value, then the method proceeds to step 622, where the software application reduces the third displacement value. At step 624, the software application retrieves a value associated with a surface characteristic of the fluid, such as surface foam. At step 626, the software application attaches the retrieved value to the mesh point. At step 628, the software application applies a mask function to the retrieved value to reveal the surface characteristic in some regions of the simulation and mask the surface characteristic on other regions. The method 600 then terminates.

Returning to step 620, if the difference is not greater than the threshold value, then the method proceeds to step 624, described above.

In sum, a fluid flow is simulated and rendered by modeling the fluid at two different resolutions. The fluid flow is first simulated and rendered at a coarse resolution, called a "base simulation," where the resolution is based on the computing resources available to perform the simulation and the amount of time available to perform the simulation and rendering. The rendered frames may be visualized as a film or video clip to view the look of the coarse simulation. Once the overall look of the base simulation is acceptable, a portion of the base simulation is selected as a domain for simulation and rendering at a finer resolution, called a "windowed simulation." The windowed simulation is typically defined by the viewing frustum of a virtual camera that includes at least part of the fluid flow within the viewing frustum. The size of the windowed simulation may be increased by one or more voxels in one, two, or all three dimensions in order to provide more realistic images at the border of the windowed simulation.

The surface of the fluid flow is modeled by attaching two uv texture maps to a mesh defining the displacement of the fluid surface. The first uv map is advected along the surface of the fluid as the fluid flows during the simulation. After some number of frames, when the original mesh has diverged such that the uv map no longer provides a realistic image of the fluid surface, the uv texture map is "reset" by reattaching the uv texture map to the current mesh at the fluid surface, and restarting the advection of the uv texture map. To hide the sudden motion where the uv texture map is reset, a second uv texture map is advected on the fluid surface, offset from the first uv texture map by some number of frames. The two advected uv texture maps are mixed using a function defining a dynamic mix constant, such that the "seams" where one of the uv texture map is reset is hidden by the other uv texture map. Surface characteristics, such as surface foam, may also be modeled by attaching a uv texture map to the surface mesh that defines the appearance of the surface characteristic, along with a mask function that defines where the surface characteristic is visible and where the surface characteristic is hidden.

In one aspect, the motion and surface characteristics of fluid flows is effectively simulated with high quality, even for large fluid bodies exhibiting calm and turbulent regions. As a result, a realistic visual effect is a achieved over a large number of shots under varying conditions.

Various embodiments of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as CD-ROM disks readable by a CD-ROM drive, flash memory, ROM chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments and numerous specific details are set forth to provide a more thorough understanding of the invention. Persons skilled in the art, however, will understand that various modifications and changes may be made thereto without departing from the broader spirit and scope of the invention. The foregoing description and drawings are, accordingly, to be regarded in an illustrative rather than a restrictive sense.

What is claimed is:

1. A computer-implemented method for simulating a fluid flow, the method comprising:
    dividing a fluid into a plurality of coarse voxels at a first resolution;
    simulating the fluid flow associated with each coarse voxel in the plurality of coarse voxels at the first resolution;
    defining a three-dimensional window that includes a portion of the coarse voxels;
    dividing each coarse voxel in the portion of the coarse voxels into a plurality of fine voxels at a second resolution;
    simulating the fluid flow associated with each fine voxel in the plurality of fine voxels at the second resolution, based at least in part on the simulation at the first resolution.

2. The computer-implemented method of claim 1, further comprising:
    calculating a first volume associated with the portion of course voxels by summing volumes for each coarse voxel in the portion of course voxels;
    calculating a second volume associated with the portion of course voxels by summing volumes for each fine voxel that lies within any of the course voxels in the portion of course voxels;
    calculating a difference between the first volume and the second volume;
    selecting at least a portion of the fine voxels; and
    adding a portion of the difference to each fine voxel in the portion of fine voxels.

3. The computer-implemented method of claim 2, wherein adding a portion of the difference to each fine voxel in the portion of fine voxels comprises:
    determining whether the magnitude of the difference is below a threshold; and
    if the magnitude of the difference is below the threshold, then adding a portion of the difference to each fine voxel at a first rate; or
    if the magnitude of the difference is not below the threshold, then adding a portion of the difference to each fine voxel at a second rate.

4. The computer-implemented method of claim 3, wherein the second rate is greater than the first rate.

5. The computer-implemented method of claim 4, wherein the threshold is a first value if the difference is negative and a second value if the difference is positive.

6. The computer-implemented method of claim 5, wherein the first value and the second value are adjustable by a user.

7. The computer-implemented method of claim 1, wherein the three-dimensional window exceeds the size of a viewing frustum by at least one coarse voxel in at least one dimension.

8. A computer-readable storage medium storing instructions that, when executed by a processor, cause the processor to model a surface of a fluid in motion, by performing the steps of:
    for simulating a fluid flow, the method comprising:
        dividing a fluid into a plurality of coarse voxels at a first resolution;
        simulating the fluid flow associated with each coarse voxel in the plurality of coarse voxels at the first resolution;
        defining a three-dimensional window that includes a portion of the coarse voxels;
        dividing each coarse voxel in the portion of the coarse voxels into a plurality of fine voxels at a second resolution;
        simulating the fluid flow associated with each fine voxel in the plurality of fine voxels at the second resolution, based at least in part on the simulation at the first resolution.

9. The computer-readable storage medium of claim 8, further comprising:
    calculating a first volume associated with the portion of course voxels by summing volumes for each coarse voxel in the portion of course voxels;
    calculating a second volume associated with the portion of course voxels by summing volumes for each fine voxel that lies within any of the course voxels in the portion of course voxels;
    calculating a difference between the first volume and the second volume;
    selecting at least a portion of the fine voxels; and
    adding a portion of the difference to each fine voxel in the portion of fine voxels.

10. The computer-readable storage medium of claim 9, wherein adding a portion of the difference to each fine voxel in the portion of fine voxels comprises:
    determining whether the magnitude of the difference is below a threshold; and
    if the magnitude of the difference is below the threshold, then adding a portion of the difference to each fine voxel at a first rate; or
    if the magnitude of the difference is not below the threshold, then adding a portion of the difference to each fine voxel at a second rate.

11. The computer-readable storage medium of claim 10, wherein the second rate is greater than the first rate.

12. The computer-readable storage medium of claim 11, wherein the threshold is a first value if the difference is negative and a second value if the difference is positive.

13. The computer-readable storage medium of claim 12, wherein the first value and the second value are adjustable by a user.

14. The computer-readable storage medium method of claim 8, wherein the three-dimensional window exceeds the size of a viewing frustum by at least one coarse voxel in at least one dimension.

15. A computing system, comprising:
a memory that is configured to store instructions for a program; and
a processor that is configured to execute the instructions for the program to simulate a fluid flow, by performing the steps of:
dividing a fluid into a plurality of coarse voxels at a first resolution;
simulating the fluid flow associated with each coarse voxel in the plurality of coarse voxels at the first resolution;
defining a three-dimensional window that includes a portion of the coarse voxels;
dividing each coarse voxel in the portion of the coarse voxels into a plurality of fine voxels at a second resolution;
simulating the fluid flow associated with each fine voxel in the plurality of fine voxels at the second resolution, based at least in part on the simulation at the first resolution.

16. The computing system of claim 15, further comprising:
calculating a first volume associated with the portion of course voxels by summing volumes for each coarse voxel in the portion of course voxels;
calculating a second volume associated with the portion of course voxels by summing volumes for each fine voxel that lies within any of the course voxels in the portion of course voxels;
calculating a difference between the first volume and the second volume;
selecting at least a portion of the fine voxels; and
adding a portion of the difference to each fine voxel in the portion of fine voxels.

17. The computing system of claim 16, wherein adding a portion of the difference to each fine voxel in the portion of fine voxels comprises:
determining whether the magnitude of the difference is below a threshold; and
if the magnitude of the difference is below the threshold, then adding a portion of the difference to each fine voxel at a first rate; or
if the magnitude of the difference is not below the threshold, then adding a portion of the difference to each fine voxel at a second rate.

18. The computing system of claim 17, wherein the second rate is greater than the first rate.

19. The computing system of claim 18, wherein the threshold is a first value if the difference is negative and a second value if the difference is positive.

20. The computing system of claim 19, wherein the first value and the second value are adjustable by a user.

* * * * *